(12) United States Patent
Ramm et al.

(10) Patent No.: US 6,605,175 B1
(45) Date of Patent: Aug. 12, 2003

(54) PROCESS FOR MANUFACTURING COMPONENT PARTS, USE OF SAME, WITH AIR BEARING SUPPORTED WORKPIECES AND VACUUM PROCESSING CHAMBER

(75) Inventors: Juergen Ramm, Sevelen (CH); Eugen Beck, Triesenberg (LI)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/257,207

(22) Filed: Feb. 25, 1999

(30) Foreign Application Priority Data

Feb. 19, 1999 (CH) .................................. 315/99

(51) Int. Cl.⁷ .......................... B32B 31/00; H05H 1/24
(52) U.S. Cl. ............................ 156/272.6; 156/273.3; 427/535; 427/569
(58) Field of Search ................ 156/272.2, 272.6, 156/273.3, 275.7, 245; 427/534–536, 569; 134/1, 1.1, 1.2; 204/192.35, 192.36, 192.37; 264/483, 272.17; 228/205; 29/841

(56) References Cited

U.S. PATENT DOCUMENTS

| 4,598,022 A | * | 7/1986 | Haque et al. ............ 156/272.6 |
| 4,921,157 A | | 5/1990 | Dishon et al. ............ 228/124 |
| 5,384,018 A | * | 1/1995 | Ramm et al. .......... 204/192.38 |
| 5,409,543 A | | 4/1995 | Panitz et al. .................... 134/2 |
| 5,832,600 A | * | 11/1998 | Hashimoto .................... 29/841 |
| 5,938,854 A | * | 8/1999 | Roth ............................. 134/1 |
| 6,203,637 B1 | * | 3/2001 | Dommann et al. ........ 156/73.1 |

FOREIGN PATENT DOCUMENTS

| DE | 4209720 | 4/1992 |
| DE | 4029368 | 8/1994 |
| DE | 4310941 | 1/1995 |
| EP | 0 371 693 | 6/1990 |
| EP | 0 427 020 | 5/1991 |
| EP | 0510340 | 5/1994 |
| EP | 0 677 737 | 10/1995 |
| WO | WO 97/39472 | 10/1997 |

OTHER PUBLICATIONS

"Römpps Chemie Lexikon", Franksche Vrelagshandlung, Stuttgart, Ninth Edition, p. 3005.
John L. Vossen et al. (editors), "Thin Film Processes", Academic Press, Inc., pp. 366–367.

* cited by examiner

Primary Examiner—Michael W. Ball
Assistant Examiner—John T. Haran
(74) Attorney, Agent, or Firm—Crowell & Moring LLP

(57) ABSTRACT

A method is disclosed for manufacturing parts with intimate connection of least two material phases, of which at least one is a solid body phase. Prior to intimate connection, at least the surface of the solid body phase to be connected is pretreated by a plasma-activated gas that contains nitrogen. The method is used, for example, for connecting integrated circuits with an HLST or for the electrical connection of the printed circuits by wire bonding or for the sheathing of electrical circuits joined with HLST and connected by wire bonding, with a potting compound. A workpiece stored in air is characterized by a surface exposed to the air, by contrast with a surface of the workpiece produced directly, having an elevated nitrogen concentration, detectable for example by a "Fourier transform infrared spectroscopy" with "attenuated total reflection" FTIR-ATR and/or with "nuclear reaction analysis," NRA and/or with "time of flight secondary ion mass spectrometry," TO-SIMS. Also disclosed is a vacuum processing chamber with a plasma discharge section, a gas supply to the chamber, connected with a gas tank arrangement, as well as with a workpiece holding device. The gas tank arrangement contains a gas with nitrogen and the holding arrangement has at least one access slit open to the discharge chamber for a disk-shaped or plate-shaped workpiece.

41 Claims, 5 Drawing Sheets

PROCESS FOR MANUFACTURING COMPONENT PARTS, USE OF SAME, WITH AIR BEARING SUPPORTED WORKPIECES AND VACUUM PROCESSING CHAMBER

BACKGROUND OF THE INVENTION

The present invention relates to a method for manufacturing parts, with intimate connection of least two material phases, of which at least one is a solid body phase, and in which method, prior to intimate connection, at least the surface of the solid body phase to be connected is pretreated, uses a workpiece stored in air and a vacuum processing chamber comprising a plasma discharge section, a gas supply operatively connected with a gas tank arrangement, and a workpiece holding device.

Definition

The term "intimate connecting method" is understood to include bonding (welding, soldering), gluing, potting, and coating, especially in a vacuum coating process, whether PVD or CVD or methods derived therefrom, as well as so-called "direct bonding." In such a method, carefully cleaned surfaces are connected to one another directly by interatomic forces, as used, for example, in direct wafer bonding of silicon on silicon, silicon on $SiO_2$, and also in the joining of metal surfaces with one another or of metal surfaces with silicon surfaces, for example CuSi or Au—Si. At least one of the surfaces to be joined intimately is always the surface of a solid body.

The following are addressed, in particular, within the framework of the present application:

(a) metal surfaces, especially made of Cu, Ni, Ag, Au Pd, Sn, Ti, In, or alloys containing at least one of these metals;

(b) semi-metallic surfaces, especially made of silicon, germanium, boron, carbon, gallium arsenide, gallium nitride, silicon carbide, zinc oxide, or of a material with at least one of these semi-metals;

(c) ceramic surfaces, especially made of quartz, aluminum oxide, aluminum nitride, zirconium oxide, boron nitride, diamond, and silicon nitride;

(d) plastic surfaces on an epoxy or ester basis, polyimides, polyvinyl chlorides, polyethylene, polystyrene, polyolymethacrylate, polyamide, polyurethane, phenoplasts, phenol resins, silokanes, Teflon; and (e) in particular, metals like those that are typically used in packaging processes for semiconductors, namely cured epoxy resins, HLST materials (semiconductor system substrates) made of epoxy (epoxy, base laminate substrates), solder resist, photo-resist, etc.

It is important that those surfaces which undergo the intimate connecting method can consist of portions different from the various materials named. The energy supply for the intimate connection inmost cases is of a thermal nature and is supplied for example by heated tools, Joule heat, UV radiation, or preferably by ultrasound to the surfaces to be joined, or by reaction energy during gluing and possibly also during potting.

The present invention in is used especially advantageously in packaging integrated circuits. In this sense, its primary area of application lies in the field of the semiconductor industry. The present invention can, however, also be used for other areas of technology, basically in all those in which, within the framework of the manufacturing method according to the invention, before the creation of an intimate connection, organic or organic/oxidic contaminating compounds must be removed from the (at least one) surface of the solid body.

Although surface materials have been defined above for which the present invention is known to be suitable, it should be noted that other surface materials, for example oxides, nitrides, carbides, oxynitrides, oxycarbides, carbonitrides, and oxycarbonitrides of at least one of the metals Ti, Ta, Zr, and Hr can be processed according to the invention, especially if the intimate connection by the coating is taken into account.

As mentioned above, the procedure according to the present invention is also especially suitable for the surfaces of solid bodies that consist of different materials, especially areas that contain different materials. As far as intimate connection is concerned, such multi-material surfaces pose especially difficult problems.

In the "packaging" of integrated circuits, as a preferred area of application of the present invention, a distinction is made between a plurality of work steps that include an intimate connection of surfaces in the above sense:

Step 1. The individual integrated circuits are cut from a silicon wafer, mounted on semiconductor system carriers (HLST) and joined with them (so-called "die-bonding"). The HLST surface to be joined is usually made of copper or nickel, silver, or gold, and/or from a material with an epoxy basis, generally from a plastic as mentioned above. Examples of such HLSTs are stamped or etched metal lead frames, ceramic substrates, or BGA (ball grid arrays)—substrate carriers made of plastic or printed circuit boards. The connecting methods used include hard soldering, soft soldering, and gluing. In flip chip soldering processes, the integrated circuit is mounted on an HLST by geometrically separate solder balls which are simultaneously used as I/O contacts.

Step 2. Joining the integrated circuits with contact supporting points on the HLST, for example on the "lead frames:" The surfaces involved are metallic, made for example of Al, Au, Cu, Ni, Pd, Ag, Pb, Sn or alloys of these metals. In this case, soldering or welding are primarily used as joining techniques, especially fluxless soldering or ultrasonic welding. This step is known as "wire bonding".

Step 3. Molding: In this method step, the circuits on the HLST, for example the lead frames, following "wire bonding" are potted with a molding compound, with the above-mentioned surfaces of the HLST and the integrated circuits being involved with the molding compound.

A cleaning method is known from EP-0 371 693 within the framework of a manufacturing method in which the surfaces later to be connected in the manner described above exclusively by applying energy are first exposed to a microwave plasma discharge in a vacuum atmosphere containing hydrogen. Then, without breaking the vacuum, the solder layer provided for connecting the surfaces is melted by the plasma discharge. Thus, a contaminated surface coating that would seriously interfere with subsequent joining processes is prevented simply by avoiding contact with air.

It is also known from U.S. Pat. No. 5,409,543 to use activated hydrogen to prepare for a soldering process. As a result, an oxide layer is singled out for the performance of the soldering process on the metal surface.

It is also known from EP-A-0 427 020 to pickle a passive and oxide layer of assembly partners with a high-frequency plasma pre-treatment with a processing gas, in other words to separate it out. The processing gases that can be used include the following gases and mixtures of the gases among others: $O_2$, $H_2$, $Cl_2$, $N_2O$, $N_2$, $CF_4$, etc. The above-mentioned pickling does not take place immediately before the soldering process as in U.S. Pat. No. 5,409,543, so that the members to be joined are stored in protective intermediate storage locations, for which purpose suitable containers under a protective gas are provided to prevent contamination.

Within the framework of the three packaging steps mentioned above, two plasma processing steps have been introduced in the meanwhile. They are intended primarily for substrate carrier materials made of plastic ("plastic ball grid arrays—PBGA"). The plasma processing before the "wire bonding" (Step 2) serves to clean the surfaces of the metal contact support points ("contact pads") usually made of aluminum, on the die (the chip) and the contact support points that are usually made of gold on the system substrate (HLST), so that electrical contact with the connecting wire, usually gold wire, is ensured. The most important source of contamination of these contact support pads is a previous treatment process ("curing") that is used for curing an epoxy adhesive used in the Step 1.

A second plasma treatment usually takes place only after the "wire bonding" (Step 2), prior to the "molding" process step (Step 3). This is intended to achieve an improved adhesion of the molding material.

Both the plasma processing steps mentioned above were usually performed in a vacuum under plasma gas excitation. A high-frequency, microwave, or ECR plasma is usually employed. The plasma surface interaction and the cleaning process associated with it or the surface modification takes place by sputtering and/or a chemical reaction with plasma-excited gases. For sputtering in a non-active atmosphere, usually it only argon is used and the self-bias potential of the substrate to be cleaned and operated floating is utilized to accelerate argon ions toward the latter and to achieve the desired removal of the cleaning material. In plasma-chemical removal, reactive gases, for example oxygen, are excited, dissociated, or ionized and then enter into a reaction with surface impurities, for example carbon, and carry away the gaseous reaction products such as $CO_2$ through the pumping system.

As in the present case, a highly advantageous processing method has become, known from WO 97/39472, by using it as the above-mentioned plasma processing method. In this process, hydrogen is excited preferably in a plasma discharge and then removes carbon from surfaces (for example as $CH_4$) while simultaneously reducing oxides on the surfaces involved, to produce $H_2O$ gas. Sputtering is avoided, which involves the risk of redeposition, and the above-mentioned process can be applied without limit to metallic substrate carrier materials or silver contact surfaces as well, that would oxidize severely in an atmosphere containing the excited oxygen, especially in a plasma containing oxygen. This would lead to an adverse effect on "wire bondability" or "moldability" (see above, Steps 2 and 3). This is also particularly important if applications for the modern copper metallization of chips is being considered. One very important property of this process is that the surfaces are passivated for a technologically sufficient period of time by the hydrogen plasma and so can be stored in air before entering into an intimate connection in the above sense.

A disadvantage of the known process is that the process window, in other words the range of process parameters still depends to a certain degree on the material of the surfaces to be processed and to be joined intimately later. Thus, for example, the plasma processing of substrate carrier materials (strips) normally takes place in magazines. These magazines have slits so that the gases excited in the plasma can penetrate to reach the substrate surfaces to be treated in the magazine and the volatile reaction products of easily can leave the magazine cleaning and be pumped off. The substrate surfaces, especially in the case of PBGA ("plastic ball grid array") strips, always consist of a plurality of different materials. The "solder resist" is a long-chain organic compound, the surface of the "die" (chip) consists for example of polyimide or silicon nitride, the metallization part usually consists of aluminum and gold.

It can never be ruled out that additional organic impurities remain on the surface of the "solder resist" that originate on strips from previous processes, e.g. cleaning steps, are precipitated during the curing of the epoxy in the "curing process", or result from the deliberate surface treatments on the "solder resist," treatments to promote for example the wettability with the molding material. Highly volatile compounds may also be present that evaporate in particular at the beginning of the above-mentioned magazines, generally in small spaces, resulting in locally high pressures. It can happen that the chemical equilibrium is altered by these by the local pressure shifts so that no more hydrocarbons can be removed from the reactive hydrogen in the above-mentioned process, but rather polymerization is promoted. The result of such re-covering can be extremely diverse. Thus, for example, at the contact support points ("contact pads") the "wire bondability" relative to the pull strength achieved is reduced, or much longer processing times are required in order to remove the deposited layer again at optimum pressure and possibly at higher temperature.

Because of the above-mentioned diversity of materials on the surface to be treated, however, a prolonged processing time or a more intense plasma processing can for example treat some surfaces such as metal surfaces, better while at the same time, others, such as the "solder resist" or the passivation layer can be changed so that the adhesion of the molding material to be added later is made worse (see the discussion of Tests II).

SUMMARY OF THE INVENTION

An object of the present invention is to provide a method for manufacturing parts in which the process window, especially the pre-treatment processing window and its dependence on various surface materials and also on process parameters such as "pressure" and "temperature," is widened. In other words, the method proposed according to the present invention, under expanded parameter ranges, such as pressure ranges and/or temperature ranges, is intended to provide uniformly satisfactory results over the entire variety of materials mentioned, as far as the quality of intimate connection to be provided later is concerned.

On the basis of this enlarged process window, an improved homogenization of the processing effect distribution is also to be ensured on multi-material surfaces.

As mentioned above, in particular, the results should also be ensured for substrates in magazines or for substrates with narrow geometries (slits and holes). Since the plasma-chemical reactions on the substrate surfaces also depend on the substrate temperature and larger temperature gradients are involved, especially for plasma processing in magazines and on extensive substrates, the above-mentioned process window enlargement is also intended to promote uniformity.

Thus, a constant surface treatment, including gap surfaces, hole surfaces, groove surfaces, etc. is to be made possible on substrates themselves.

In addition to the re-covering of the treated surface by deposition or polymerization being prevented, the method of the present invention is economical, and no explosives and/or environmentally hazardous gases need be used. The advantages of the above-mentioned known methods, such as the one described in WO 97/39472, especially its preservative properties are maintained.

The following additional definition applies: passivation or passivized; see Römpps Chemielexikon, Franksche Vrelagshandlung, Stuttgart, $9_{th}$ Edition, Page 3005. This term refers to a bonded protective coating on the surface of the solid. The clean solid body surface is protected against atmospheric air influences. This is accomplished by, for example, forming an oxide or nitride layer. Such a layer must first be broken up by energy applied specifically for this purpose for producing an intimate connection of the type described above, for example by application of higher temperatures than required for the actual joining process, or chemically, for example by using a flux.

A basic distinction exists between the above-mentioned "passivation" and preservation which in particular does not require any layer separation by additional energy for joining. This preservation is known in conjunction with the method in WO 97/39472, the disclosure of which is incorporated herein by reference.

The above object has been achieved by a method in which the pre-treatment is performed using plasma-activated gas that contains nitrogen. In addition, in a currently preferred embodiment of a manufacturing method according to the invention, the plasma-activated gas also contains hydrogen.

Although it is quite possible to use any one of the many known plasma discharge types for plasma activation of the above-mentioned gases, in a currently preferred embodiment the plasma discharge is produced as a low-voltage discharge, preferably with a thermionic cathode. In addition, the plasma-activated gas preferably contains a working gas, preferably a noble gas, especially argon.

The above-mentioned plasma-activated gas, in additional to nitrogen, contain certain gas components, especially hydrogen and/or a working gas, can contain in a preferred manner primarily nitrogen, and can even consist of nitrogen apart from any working gas that might be provided.

The solid body surfaces to be joined intimately are materials that are metallic and/or semi-metallic and/or ceramic and/or consist of plastic, especially according to the materials mentioned at the outset and deemed currently preferred. Preferentially, the above-mentioned solid book solid body surfaces are surfaces with areas composed of different materials, especially the materials mentioned.

Th intimate connection is formed by the manufacturing method according to the present invention, preferably by gluing, soldering, welding, molding, or coating, especially vacuum coating, performed by so-called "direct bonding."

The above-mentioned, preferentially-used low-voltage discharge is also operated preferentially with a discharge voltage of 30 V or more, preferably with a discharge current between 10 A and 300 A, including both limits, especially at 40 A to 70 A.

In a currently preferred embodiment of the method according to the invention, the at least one solid body surface to be connected intimately later, following the above-mentioned pretreatment and prior to its intimate connection, is exposed to air, for periods ranging from days to weeks. Thus, it is no longer necessary to further process the above-mentioned surface immediately after its pretreatment and at the same location. The result is a high degree of flexibility regarding "rhythm" and processing location for working the method according to the invention without requiring additional costly cleanliness precautions such as storage under a protective gas to be provided.

In an especially preferred embodiment of the method according to the present invention, at least the one solid body phase is stored in a holder during pre-treatment. The holder defines access areas on the above-mentioned surface that are narrowed relative to the plasma discharge chamber. In the overwhelming majority of cases, the at least one solid body phase is formed by a disk- or plate-shaped substrate, and the holding device is provided with at least one access slit. Preferably, the holding system has several of the above-mentioned access slits and forms an actual magazine.

One preferred use of the method according to the present invention consists in joining integrated circuits with HLST or in the electrical connection of integrated circuits by "wire bonding," or for sheathing electrical circuits connected with HLST and connected by "wire bonding" with a molding material.

Another preferred use of the method according to the present invention is for integrated circuits for flip chip connection and for positioning. Firstly, the soldering points can be cleaned of oxide and passivated at the same time and secondly, following plasma processing, a better wetting of the so-called "underfill" (a molding material that fills the gap between the chip and the chip carrier and which serves to absorb mechanical stresses) is achieved.

In addition, the method according to the invention is also used preferably for workpieces with surfaces to be connected intimately with poorly accessible surface areas, especially edges, holes, blind holes, gaps, and grooves. The method according to the invention is also especially suitable for chips with copper traces.

The workpiece that has been processed with plasma according to the present invention and stored in air is characterized by the fact that the above-mentioned surface that has been exposed to air has an increased nitrogen concentration by comparison with a directly produced surface of the workpiece which however was not stored in air. This can be demonstrated by, for example, "Fourier transform infrared spectroscopy" with "attenuated total reflection," FTIS-ATR, and/or with "nuclear reaction analysis," NRA, or with "time-of-flight secondary ion mass spectrometry," or TOP-SIMS.

As a result of the elevated nitrogen concentration, which indicates,the pre-treatment according to the present invention, the workpiece according to the invention can be used and stored in air directly without additional pretreatment in the above sense for an intimate connection. In yet another currently preferred embodiment of the method according to the invention, the intimate connection can be performed by the influence of heat on air, preferably at a solid body temperature of 150° C. at most.

A vacuum processing chamber according to the invention is also characterized by a gas tank arrangement containing a gas with nitrogen and at least one access slit open to the discharge chamber for a disk-shaped or plate-shaped-workpiece.

The influence of nitrogen as recognized and utilized according to the present invention is surprising, in the light of the teaching in the art (see J. L. Vossen et al., "Thin Film Processes," Academic Press, Inc. 1978) according to which conventional thinking believed that nitrogen plasmas did not remove polymer surfaces.

BRIEF DESCRIPTION OF THE DRAWINGS

Other objects, advantages and novel features of the present invention will become apparent from the following detailed description of the invention when considered in conjunction with the accompanying drawings.

DETAILED DESCRIPTION OF THE DRAWINGS

In the manufacturing method according to the invention, the plasma discharge for exciting the gas is preferably designed as a low-voltage,arc discharge. Systems of this type are described, for example, in DE-OS 43 10 941, corresponding to U.S. Pat. No. 5,384,018; DE-4 029 270, corresponding to EP-478 909 and DE-4 029 268, corresponding to U.S. Pat. No. 5,336,326; and EP-510 340 corresponding to U.S. Pat. No. 5,308,950. These documents, provided only as example, show all of the processing chambers for workpieces using low voltage arc discharges. As far as the configuration of such processing chambers is concerned, the disclosure of these documents is incorporated by reference herein.

Figure 1:
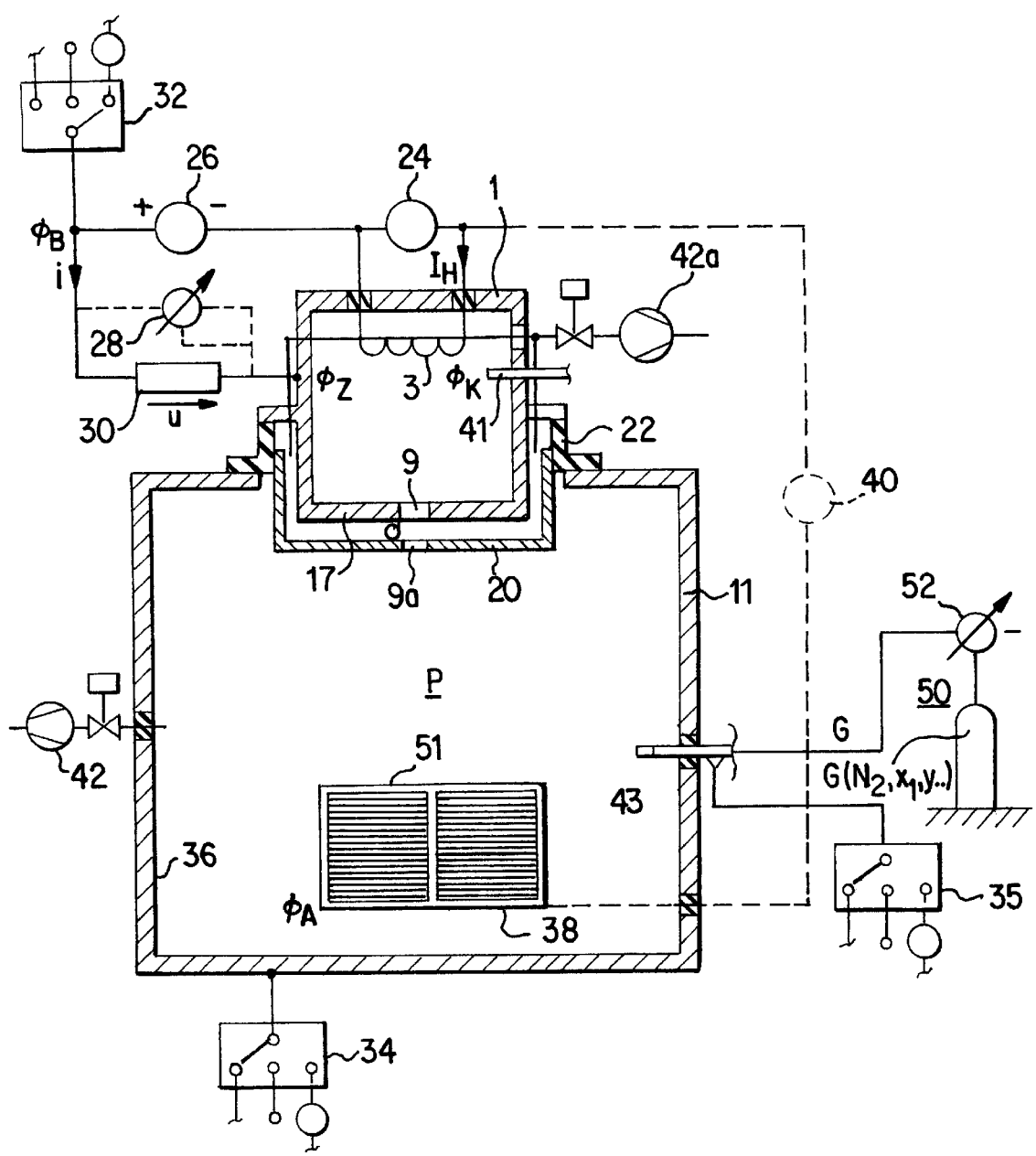
FIG. 1 is a schematic diagram of the structure of a system according to the invention as used for the experiments described below.

In FIG. 1, a preferred system for use according to the present includes a cathode chamber 1 in which a thermionic cathode 3 is insulatingly mounted. Parts 17 of cathode chamber 1 surround a diaphragm opening 9. Cathode chamber 1 is mounted by insulating supports 22 on the wall of processing chamber 11 and includes a shield 20, which is operated with floating potential, relative to both the cathode chamber 1 and also relative to processing chamber 11, the parts 17 at the dark space distance d up to directly into the area of diaphragm opening 9.

The thermionic cathode is operated by a source 24 with heating current $I_H$ and is guided by a voltage source 26 and, generally speaking, a unit 28 on at least a part of the cathode chamber wall, preferably on the cathode chamber wall itself. Unit 28 acts as a current limiter and causes a voltage drop u as a function of the current i flowing through it. As indicated by the dashed lines, it can be in the form of a current-controlled voltage source but is preferably in the form of a passive circuit element, especially a resistance element 30.

The positive pole of voltage source 26 can be set to a reference potential, either ground or another specified potential, or can be operated in a potential-free manner as shown purely schematically by the switch 32. Similarly, since it is electrically insulated from cathode chamber 1, the processing chamber 11, as shown schematically with switch 34, can be operated at ground potential, a reference potential, or possibly even at a floating potential.

The processing chamber inside wall 36, or at least parts thereof, can be connected as the anode relative to the thermionic cathode 3; preferably, however, a separate anode 38 as indicated by the dashed lines, can be connected by a voltage source 40 relative to the thermionic cathode 3 as an anode, i.e. positively. Anode 38 is then used preferably as the workpiece carrier for the workpieces W shown schematically.

A working gas, preferably argon, is supplied through gas supply line 41 to the cathode chamber,. Through another gas supply line 40 shown schematically, as indicated schematically by the switch 35, depending on the potential connection, chamber 11 can be connected to the potential, the gas G (X, Y, $N_2$) containing preferably nitrogen is supplied by a gas tank arrangement 50. The gas G is admitted by a valve 52 shown schematically Especially in the industrial application of the method according to the invention, a magazine 51 is used as the workpiece carrier 51, with the processing chamber according to the invention shown schematically in FIG. 1. A plurality of substrates to be processed is stacked therein and connected only by insertion slits on the front and/or rear for the substrates, as well as access slits 51a additionally provided in the magazine wall. The geometric ratio H relative to the remaining communication openings (access slits) between the substrate surfaces and processing chamber P can then be much smaller than the dark space distance of the plasma discharge maintained in the chamber. The surface processing used according to the invention is performed by the gas containing nitrogen that is excited by the discharge and enters the magazine through the abovementioned openings and slits.

Figure 7:
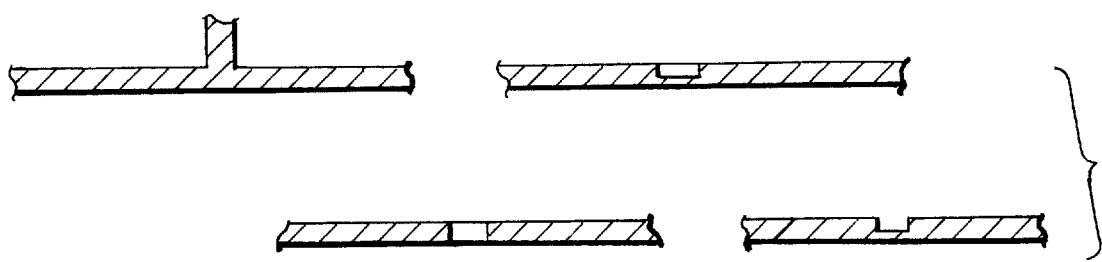
FIG. 7 is a schematic cross sectional view of areas of substrates that are also suitable for using the method according to the invention.

It is readily apparent that the processing method used according to the invention is suitable for cleaning surface areas that are difficult of access on workpieces and/or substrates, for example edges, holes, blind holes, grooves, etc., the surface areas subsequently serving for an intimate connection. Such surface areas are shown schematically in FIG. 7.

A pumping system 42 is provided to pump down chamber 11 and possibly cathode chamber 1 as shown, with a pumping system 42a possibly being provided as well in order to pump down the cathode chamber separately. The diaphragm arrangement with diaphragm opening 9 act as the pressure stage between the pressure in the cathode chamber 1 and the pressure in the processing chamber 11.

The wall of cathode chamber 1 forms the ignition electrode; to ignite the low voltage discharge, the thermionic cathode 3 is heated to electron emission with heating current $I_H$ and argon is admitted to the cathode chamber. Because of the distance ratio between the wall of cathode chamber 1 and cathode 3, as a result of the application of the potential of the latter, the discharge is ignited, whereupon a current i flows through unit 28, especially resistance 30. This reduces the potential $\Phi_z$, previously at the ignition value, of the cathode chamber wall 17, with the wall of chamber 1 acting as an anode during operation only to a negligible degree and the primary discharge being drawn by the diaphragm arrangement with opening 9 to the anode 38 on the processing chamber side.

With a chamber like that shown in FIG. 1, the surfaces of connecting workpieces were treated. These were, for example:

(i) metal lead frames for soft soldering, for example made of copper, nickel plated-copper, and silver-plated copper;

(ii) organic HLST materials, such as BGA ("ball grid arrays") and MCM ("multichip modules"), for example on an epoxy or ester basis, as well as PCBs, "printed circuit boards");

(iii) metallic QFP ("quad flat packs"), for example made of copper, silver-plated copper, or palladium-plated copper;

(iv) the metallization of the traces for the organic HLST materials and the QFP, for example made of silver-plated copper, gold-plated copper, or gold;

(v) semiconductor substrate carriers designed as flip chip with soldering points made for example of AgSn, PbSn, PbSnAg, and PbInAg;

(vi) HLST materials on a ceramic basis, for example aluminum oxide;

(vii) surface protecting layer of the chips, for example made of silicon nitride, silicon oxynitride, and polyimide; and (viii) directly bonded Si—Si wafers.

Description of Processing:

The processing chamber according to FIG. 1 which was used for the tests to be described had a volume of V=150 liters The workpieces of the type described above were placed in the chamber and the operation was as follows:

1. Pumping down to a basic pressure of approximately 10* mbar;

2. Activation of cathode 3 with $I_H$ approximately 190 A;

2.1 Argon/hydrogen plasma (reference test)

Discharge current: Test I: 50 A

Test II: 60 A

Argon flow: 20 sccm

Processing time: Test I: 10 minutes

Test II: 10 and 20 minutes 2.2 Pretreatment in argon plasma (2d reference example)

Discharge current: Test I: 50 A

Test II: 60 A

Argon flow: 20 scam;

Processing time: Test I: 10 minutes

Test II: 10 and 20 minutes.

2.3.2 Treatment according to the invention (combination of nitrogen and hydrogen).

Discharge current: Test I: 50 A

Test II: 60 A

Argon flow: 20 scam

Nitrogen and hydrogen flows: total 20 scam, 4 vol. % hydrogen

Processing time: Test I: 10 minutes

Test II: 10 to 20 minutes 2.4. Pretreatment according to the invention ($N_2$ only).

Arc current: Test I: 50 A

Test II: 60 A

Argon flow: 20 scam

Nitrogen flow (pure): 20 scam

Processing time: Test I: 10 minutes

Test II: 10 to 20 minutes.

In all tests, following a heating time of the thermionic cathode that was about 30 seconds, with a heating current of approximately 190 A, an ignition voltage between cathode 3 and ignition electrode 17 (see FIG. 1) was applied. Resistance 30 was set to approximately 28 ohms and connected to ground. Following ignition of the discharge (ignition voltage approximately 20–30 V) a discharge voltage develops between cathode 3 and anode 38 of approximately 25 V at 50 A discharge current, with preferred use of a welding generator if the recipient wall 11, at ground, is used as the anode.

Ions and excited neutrons are generated for which the typical plasma glow is an indication. The workpieces to be processed in the magazines were surface-treated in the plasma thus produced. The nitrogen and possibly the hydrogen-volatile compounds with impurities were pumped off by pumping system 42.

The working pressure was approximately $5 \times 10^{-3}$ mbar.

As shown in FIG. 1, magazines 51 were used that had access slit widths H. (see FIG. 1) from 1 mm to 10 mm.

Instead of the magazine and hence the workpieces being placed at ground potential, the latter in particular (set to floating potential or to a different reference potential) are exposed to the plasma processing. The fact that the potential of the workpieces relative to the plasma potential in the low-voltage discharge described above is very low, 20 V or less, both the problem of redeposition of material on the workpieces as occurs in so-called free sputtering, and also in particular the danger of the destruction of integrated circuits that are critical with respect to electrical potential differences can be ruled out. Cleaning and preservation take place solely by chemical processes which are effected either by electrons, with workpieces suitably connected to potential, or by low-energy ions and electrons in workpieces that are operated to be floating.

The large number of electrons injected into the plasma ensures a high reactivity of the plasma, and hence short processing times, which is critical for the economy of the proposed method. Another advantage is that the plasma penetrates small hollow spaces especially in the magazine shown. Thus for example workpieces can be processed without removing them from the cassette or magazine shown here, which is especially economical.

PBGA-HLST as well as "lead frames" with copper surfaces were processed as workpieces for subsequently producing a soft-soldered connection.

Figure 3:
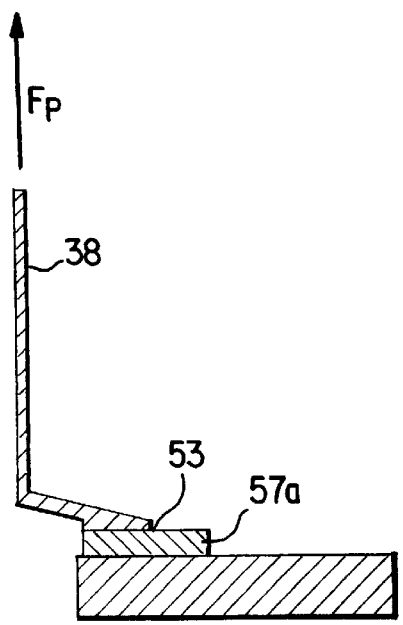
FIG. 3 is a schematic cross-sectional view of the definition of tensile stress or pull strength Fp of "wire bond" connections.
Figure 4:
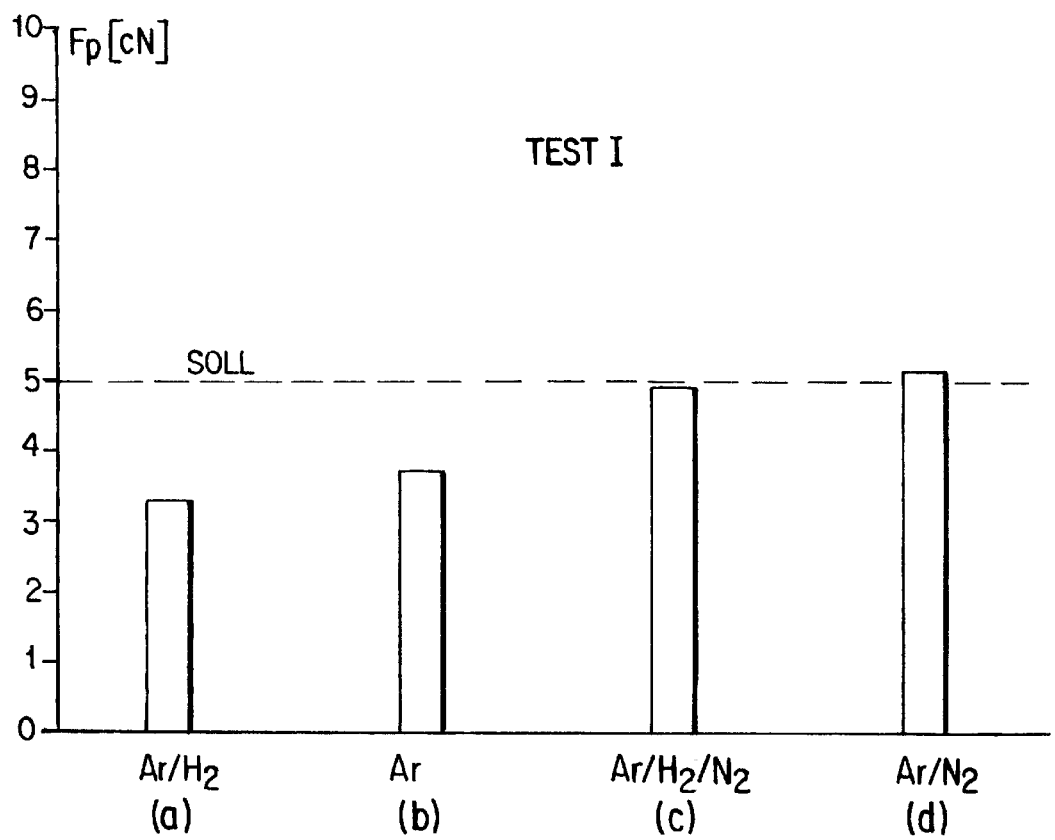
FIG. 4 is a graph showing the results of tensile stress capacity tests ("pull strength"), performed as indicated with reference to FIG. 3, with (a) hydrogen-argon plasma processing, (b) argon plasma processing, (c) treatment in an $Ar/N_2/H_2$ plasma, and (d) processing in an argon/nitrogen plasma.

Results:

FIG. 4 presents the tensile strength results. The tensile strength and pulling force $F_p$ of the intimate connections were measured on the PBGA-HLST processed according to the invention, the connections being produced by gold wire bonding. FIG. 3 shows this procedure schematically. 53 indicates the connecting point with the surface of a "lead frame" 57a treated according to the invention.

The surfaces of the treated substrates had previously been treated by the manufacturers in unknowable ways. Following this pretreatment, the danger of a redeposition from the gas phase, in other words plasma polymerization, on the surface was foreseeable.

On the substrates not subjected to further treatment, obtained directly from the manufacturers, no "wire bonding" connections were made. The resultant tensile strengths are shown in FIG. 4 for Test I. The treated substrates are precisely the substrates that are unsuited for an argon/hydrogen plasma treatment: the feared redeposition from the gas phase, in other words plasma polymerization, did in fact occur during argon/hydrogen plasma treatment, as indicated by the relatively poor tensile strength results (a).

A tensile strength of approximately 3.3 cN was measured.

With treatment in argon plasma, slightly better results (b) were obtained, with a tensile strength of approximately 3.6 cN. Evidently the simple heating of the substrate surfaces and the associated desorption alone produced better values than could be achieved in argon/hydrogen plasma because of plasma polymerization.

Definitely better results were measured as the result of treatment according to the invention, namely in an argon/nitrogen plasma with a low hydrogen component, in the present case approximately 4 percent according to (c) and in argon/nitrogen plasma according to (d). It should be noted at this point that if hydrogen is mixed with the gas G to be excited, which in any event would result in a smaller amount that if the gas contained nitrogen.

In the substrates treated according to the invention, tensile strengths of approximately 5 cN (c) or far more than 5 cN were measured (d).

Basically, specified tensile strengths of 5 cN were usually required for the connections described.

Figure 5:
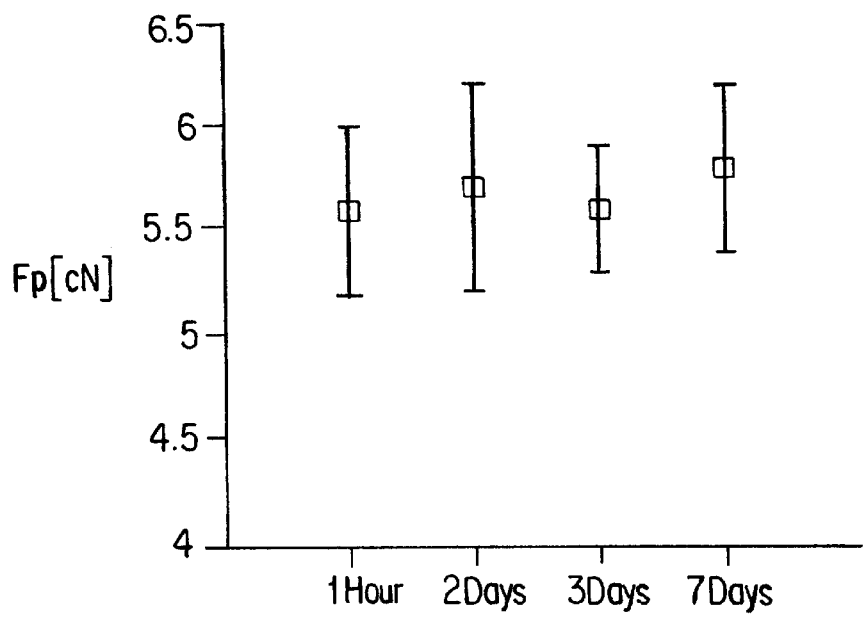
FIG. 5 is a graph, on the basis of a time/pull strength showing the long-term effect on the plasma processing used according to the present invention and the pull strength of intimate connections formed on workpieces according to the invention.

FIG. 5 shows the long-term effects of the cleaning effect for substrates which, as just described, were treated according to Test 1 (c), in other words in to argon/nitrogen/hydrogen (4 vol. %) plasmas.

The tensile strength $F_p$ is reduced, and the storage time of the treated substrates in air up to the preparation of the "wire bondings.".

It turns out that the measured tensile strength values remain unchanged within measurement accuracy for seven days, in other words there was no re-contamination of the surfaces exposed in the plasma processing procedure.

Figure 6:
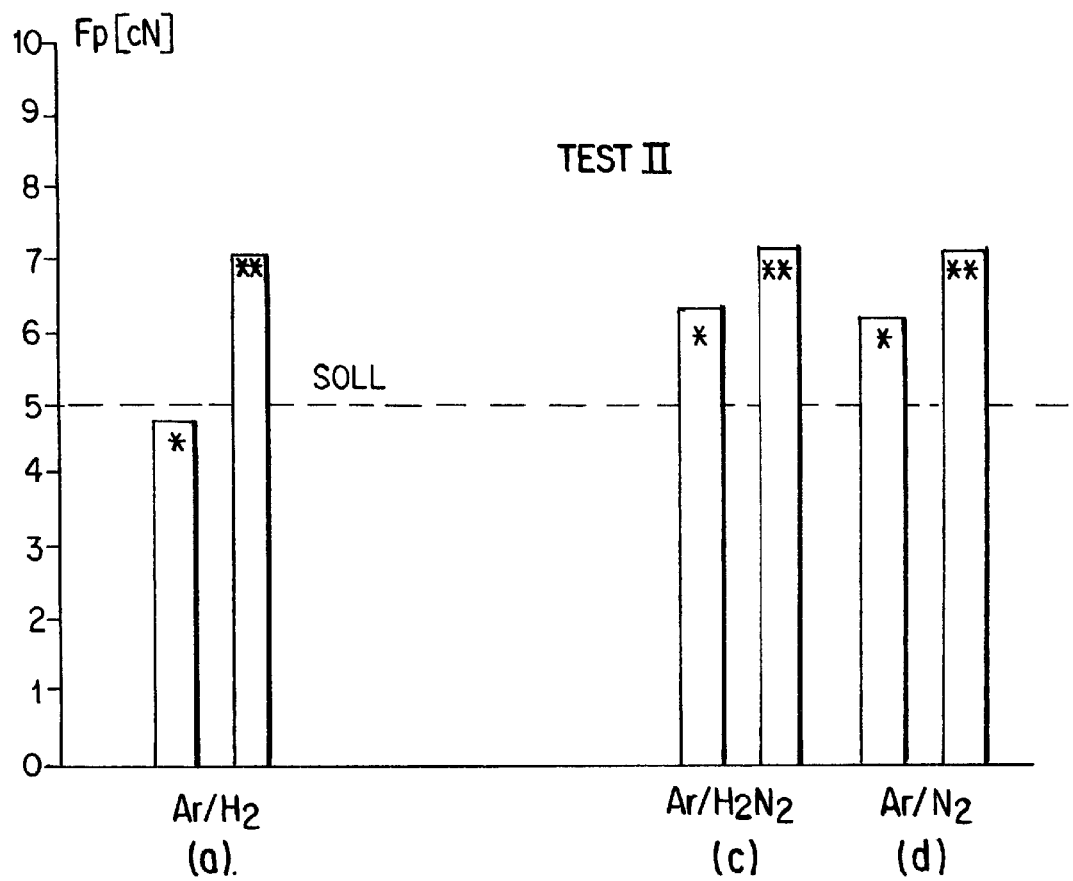
FIG. 6 is similar to FIG. 4 but shows the results of additional pull strength tests.

FIG. 6. shows the results of Test II by analogy with the tests according to FIG. 4. The results marked "*" were obtained with a 10-minute treatment, while those marked "**" were obtained with a 20-minute treatment. The discharge current as mentioned above was 60 A. The tests (a to d) according to FIG. 6 and those according to FIG. 4 correspond. In FIG. 6 the tests on the substrates treated in Ar plasma are not shown but they were much worse than the tests according to (a), in other words in the argon/hydrogen plasma.

From this it is clear that despite a higher discharge current as compared with Test I, with a 10-minute processing in argon/hydrogen plasma (a), the required 5 cN tensile strengths were still not reached. For the plasma processing according to (c) and (d) however they have, even with the abovementioned 10-minute treatment at 60 A arc current, far above the required value, namely approximately 6.5 cN (c) and 6 cN (d). Thus, similarly good results can be obtained in argon/hydrogen plasma only by lengthening the processing time. This involves a higher thermal load on the substrates, and with a longer processing time undesired effects can occur on substrates with different additional material surfaces. While in substrates treated according to (c) and (d) according to the invention, no problems occurred with subsequent "molding," in the substrates (FIG. 6) processed according to (a) a partial delamination of the "molding" material was observed. Precisely this indicates that even with respect to materials that are used, the processing method employed according to the invention has a wider processing window.

It is also important to note that the tensile capacity tests presented in FIG. 6 were performed on substrates five days after their plasma processing according to the invention, while Tests I according to FIG. 1 result during bonding on the same day on which the plasma processing was performed.

Figure 2:
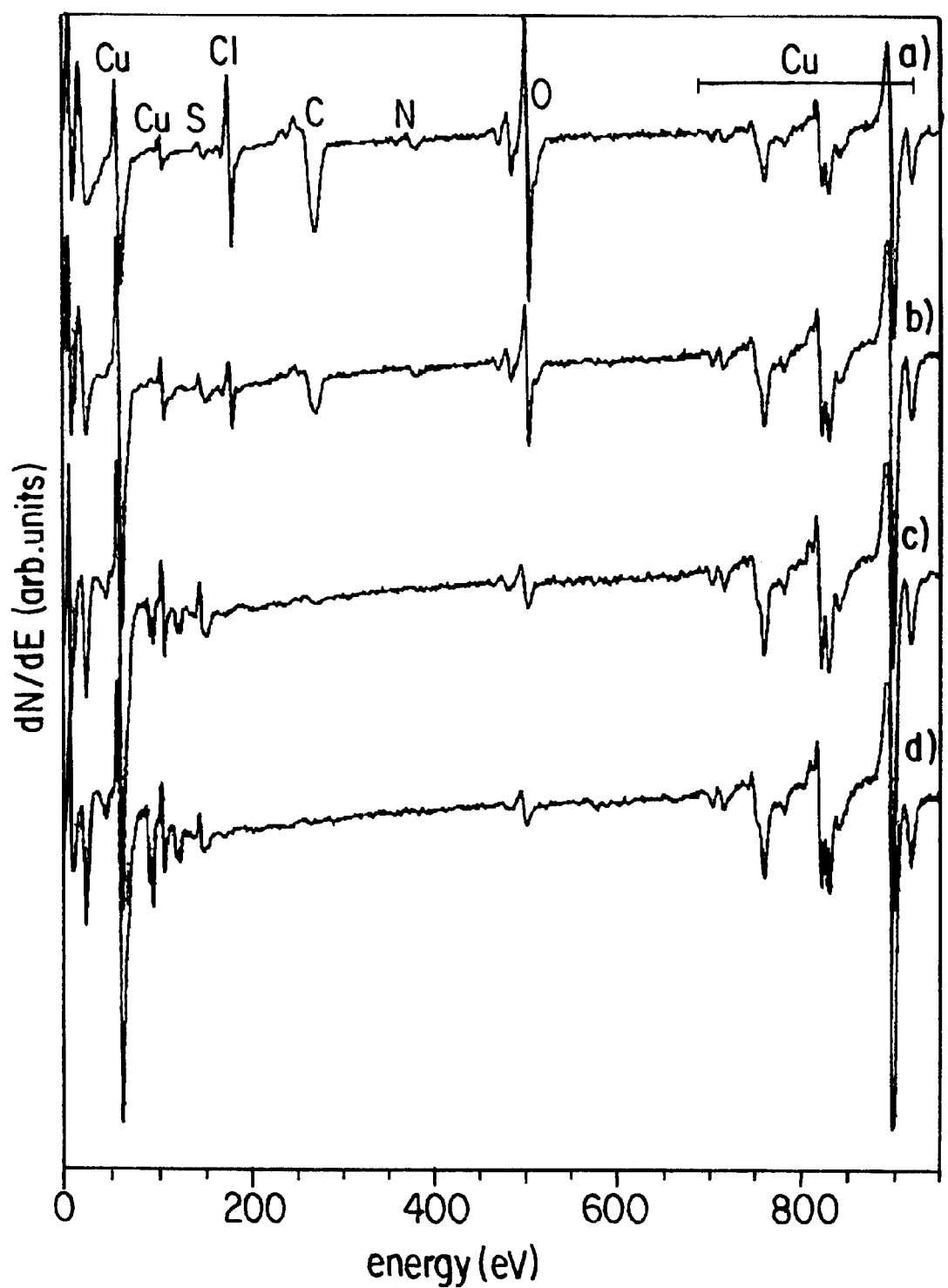
FIG. 2 shows the Auger spectrum of copper surfaces ("lead frames") for producing a soft-soldered connection.

In FIG. 2, finally, the Auger spectrum of copper surfaces ("lead frames") for producing a soft-soldered connection are shown.

Spectrum (8) was recorded on a "lead frame" not treated according to the invention.

Spectrum (b) was recorded following a 2-minute pretreatment according to the invention according to FIG. 4, Test I (d), spectrum (c) was recorded following a 4-minute pretreatment of this kind, while spectrum (d) was recorded following a 6-minute pretreatment of this kind. It is particularly the development of the C peak at 271 eV and the N peak at 379 eV and the O peak at 503 eV that demonstrate the cleaning action of the method according to the invention. The substrates on which the spectra according to FIG. 2 were recorded were treated for the described processing times in argon/hydrogen/hydrogen (4%) plasma. With treatment in argon/nitrogen plasma according to (d) in FIGS. 4 to 6 the behavior relative to C and N remains essentially the same but oxygen is not completely reduced.

According to the invention, workpieces that have been treated in a plasma with nitrogen and then simply stored in air, as mentioned above, are marked by their significant surface nitrogen concentration.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for manufacturing a part for further processing, comprising:
   providing a first part having a metallic, semi-metallic, ceramic or plastic material surface;
   establishing a vacuum plasma to construct a contact surface on said first part;
   activating a gas primarily comprising nitrogen with said vacuum plasma;
   exposing said surface of said first part to said activated gas; and
   removing said first part from exposure to said activated gas and storing said first part in ambient air.

2. The method of claim 1, wherein said plasma-activated gas further comprises hydrogen.

3. The method of claim 1, further comprising generating a low voltage plasma discharge for plasma activating said gas.

4. The method of claim 3, further comprising generating said low voltage plasma discharge by a cathode that thermionically emits electrons.

5. The method of claim 3, further comprising generating said low voltage plasma discharge with a discharge voltage of at most 30 V.

6. The method of claim 3, further comprising generating said low voltage plasma discharge with a discharge current of not lower than 10 A and not larger than 300 A.

7. The method of claim 1, wherein said gas further comprises a working gas.

8. The method of claim 7, wherein said working gas is a noble gas.

9. The method of claim 8, wherein said noble gas is Argon.

10. The method of claim 1, further comprising holding said first part during said treating and operatively communicating said surface of said first part via an access area to a plasma discharge area, said access area being narrower than said plasma discharge area.

11. The method of claim 1, wherein said part is one of a disk-shaped and plate-shaped substrate, and wherein, during said exposure to the activated gas, said contact surface of said first part is linked to an area with a plasma discharge via a slit.

12. The method of claim 1, further comprising providing said substrate during said treating within a magazine defining access slits towards an area with a plasma discharge.

13. The method of claim 1, wherein said first part comprises an integrated circuit.

14. The method of claim 1, wherein said part is a HLST.

15. The method of claim 1, wherein said contact surface is the surface of one of an edge, a hole, a blind hole, a gap, and a groove.

16. The method of claim 1, wherein said part comprises a chip having copper conductors.

17. The method of claim 1, wherein said first part is comprised of copper.

18. The method of claim 1, wherein said first part is comprised of copper.

19. A method for manufacturing a device, comprising:
providing a first part having a metallic, semi-metallic, ceramic or plastic material surface;
establishing a vacuum plasma;
activating a gas primarily comprising nitrogen with said vacuum plasma;
exposing said surface of said first part to said activated gas;
removing said first part from exposure to said activated gas and storing said first part in ambient air; and
directly intimately connecting a second part to said surface having been exposed to said activated gas and ambient air.

20. The method of claim 19, wherein said direct intimate connecting is performed by one of gluing, soldering, welding, casting, coating, and direct bonding.

21. The method of claim 20, wherein the coating for performing the direct intimate connecting is a vacuum coating.

22. The method of claim 19, further comprising performing said direct intimate connecting at ambient air.

23. The method of claim 22, further comprising maintaining temperature of said first part at at most 150° C. during said direct intimate connecting.

24. The method of claim 19, wherein said first part comprises an integrated circuit and said second part comprises a HLST.

25. The method of claim 19, wherein said plasma-activated gas further comprises hydrogen.

26. The method of claim 19, further comprising generating a low voltage plasma discharge for plasma activating said gas.

27. The method of claim 26, further comprising generating said low voltage plasma discharge by a cathode that thermionically emits electrons.

28. The method of claim 26, further comprising generating said low voltage plasma discharge with a discharge voltage of at most 30 V.

29. The method of claim 26, further comprising generating said low voltage plasma discharge with a discharge current of not lower than 10 A and not larger than 300 A.

30. The method of claim 19, wherein said gas further comprises a working gas.

31. The method of claim 30, wherein said working gas is a noble gas.

32. The method of claim 31, wherein said noble gas is Argon.

33. The method of claim 19, further comprising holding said first part during said treating and operatively communicating said surface of said first part via an access area to a plasma discharge area, said access area being narrower than said plasma discharge area.

34. The method of claim 19, wherein said part is one of a disk-shaped and plate-shaped substrate, and wherein, during said exposure to the activated gas, said contact surface of said first part is linked to an area with a plasma discharge via a slit.

35. The method of claim 34, further comprising providing said substrate during said exposure to the activated gas within a magazine defining access slits towards an area with a plasma discharge.

36. The method of claim 19, wherein said at least a material comprises an integrated circuit.

37. The method of claim 19, wherein said first part is a HLST.

38. The method of claim 19, wherein said contact surface is the surface of one of an edge, a hole, a blind hole, a gap, and a groove.

39. The method of claim 19, wherein said first part comprises a chip having copper conductors.

40. The method of claim 19, wherein the direct intimate connecting is performed by ultrasonic welding.

41. The method of claim 19, wherein said first part is comprised of copper.

* * * * *